United States Patent [19]

Petersen

[11] 4,317,611
[45] Mar. 2, 1982

[54] OPTICAL RAY DEFLECTION APPARATUS

[75] Inventor: Kurt E. Petersen, San Jose, Calif.

[73] Assignee: International Business Machines Corporation, Armonk, N.Y.

[21] Appl. No.: 150,839

[22] Filed: May 19, 1980

[51] Int. Cl.³ ............................................. G02B 27/17
[52] U.S. Cl. ..................................... 350/6.6; 350/486
[58] Field of Search ...................... 350/6.6, 6.91, 486, 350/269, 360, 361; 324/97; 250/230, 235; 358/208; 310/36, 38

[56] References Cited

U.S. PATENT DOCUMENTS 3,886,310  5/1975  Guldberg et al. ................... 350/360
4,229,081  10/1980  Jones et al. ......................... 350/486

Primary Examiner—Jon W. Henry
Attorney, Agent, or Firm—G. E. Roush

[57] ABSTRACT

Torsional type optical ray deflection apparatus essentially comprises a pair of etched plates, one of which is single crystal semiconductor material such as silicon, and the other is a suitable insulating material such as glass. The semiconductor plate is etched to form an elongated bar of the material having a wider central portion which forms a reflecting surface armature of suitable area suspended internally of the rectangular frame formed by the remainder of the semiconductor plate. The insulating plate is etched to leave an annuloidal depression centrally of the plate. An elongated land in the center of the insulating plate underlies the reflecting surface area and the torsion bars in order to support the torsion bar-reflector structure in the direction normal to the longitudinal axis while allowing rotation about that axis. Planar electrodes are laid down in the bottom of the depression in the insulating plate for exerting an electrostatic force between one of the electrodes and the semiconductor armature, thereby causing angular displacement about the longitudinal axis of the torsion bars which will deflect rays of light incident to the reflecting surface portion.

8 Claims, 8 Drawing Figures

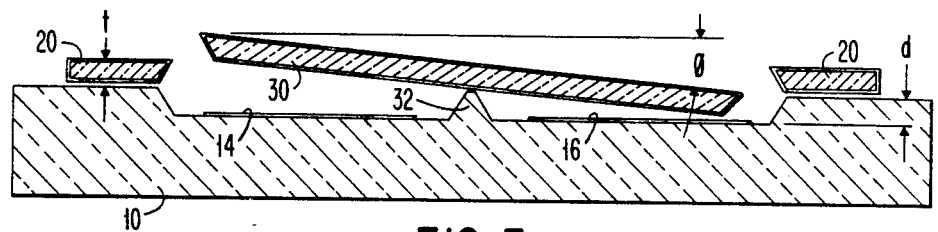
FIG. 3
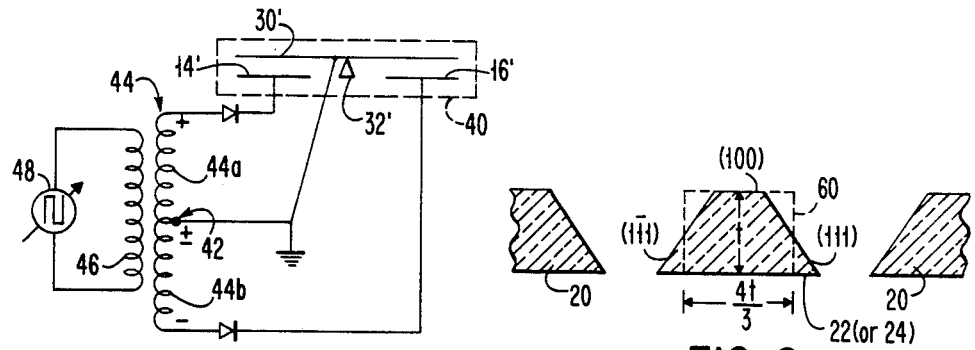
FIG. 4
FIG. 6
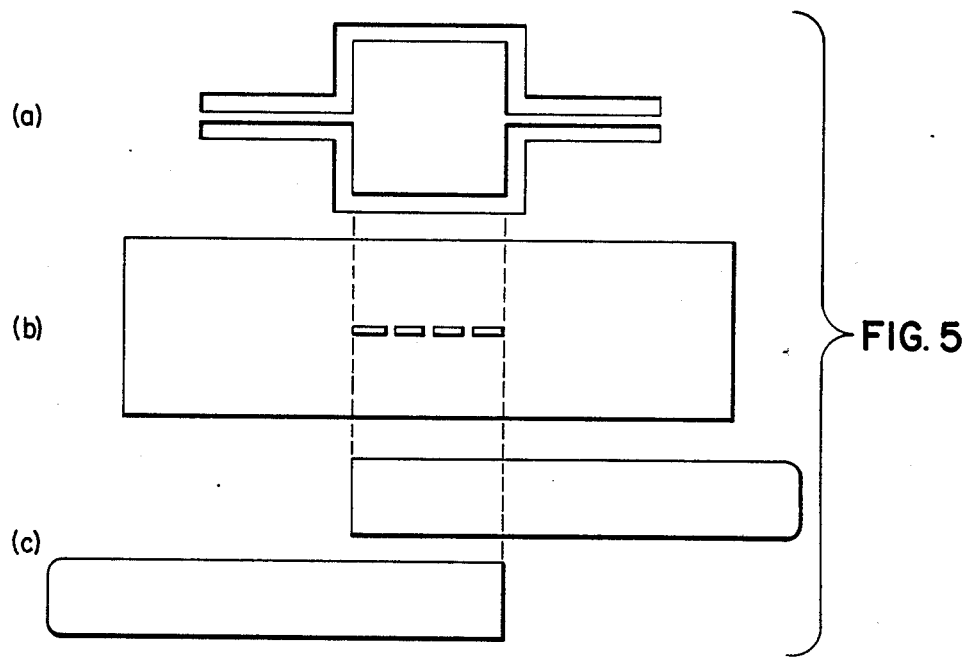
FIG. 5

OPTICAL RAY DEFLECTION APPARATUS

FIELD

The invention relates to optical ray deflection apparatus, and it particularly pertains to such apparatus having torsion bar activating means, and formed of a relatively few easily fabricated component parts.

BACKGROUND

Optical deflection apparatus having mirrors actuatably supported on torsion bars are well known, however, most of the known apparatus is rather complex in construction and expensive to fabricate. Present day applications in which optical deflection apparatus may be used frequently afford the opportunity for using relatively large numbers of identical devices. In most, if not all applications, simple, compact and inexpensive mechanisms are highly desirable, if not absolutely necessary.

SUMMARY

In accordance with the invention, the objects indirectly referred to hereinbefore, and those that will appear as the specification progresses, obtain in simple torsional type optical ray deflection apparatus essentially comprising a pair of etched plate members, one of which preferably is single crystal semiconductor material such as silicon and the like, and the other is a suitable insulating material such as glass (silicon may also be used as will be discussed hereinafter). The semiconductor plate member is etched to form an elongated bar of the material having a wider central portion which forms a reflecting surface armature of suitable area and the optical deflection apparatus, all suspended internally of the rectangular frame formed by the remainder of the semiconductor plate member. The insulating plate member is etched to leave a rectangularly shaped annuloidal depression centrally of the plate member. This moat-like depression is arranged about an elongated land in the center of the insulating plate member which is to underly the reflecting surface area of the semiconductor plate, and is to be aligned with the torsion bar portions of the latter plate member. The land tends to support the torsion bar-reflector structure in the direction normal to the longitudinal axis of the torsion bar portion, but allows rotation about that axis to the desired, although limited, degree required.

A pair of planar electrode members are laid down in the bottom of the depression in the insulating plate member on either side of the land for use in exerting an electrostatic force between one of the electrode members and the semiconductor armature member for causing angular displacement about the longitudinal axis of the torsion bar portions which will deflect any ray of light incident to the reflecting surface portion as it is moved. Enhanced operation is afforded by grounding the armature, that is the reflective portion, by electric connection to the semiconductor plate member and applying potential differentially to both electrodes.

Further, in accordance with the invention, two or more such optical ray deflection devices arranged in parallel relationship are used for increasing the total deflection angle, and two such optical ray deflection devices arranged in one plane but having the longitudinal axes normal to each other provide an X-Y scanning arrangement of considerable application.

PRIOR ART

There is prior art having some structure in common with the structure according to the invention as is found in these U.S. Pat. Nos.:

| | | | |
|---|---|---|---|
| 3,234,844 | 2/1966 | Fain et al | 88/1 |
| 3,436,139 | 4/1969 | Barkow | 350/6 |
| 3,436,546 | 4/1969 | Derderian et al | 250/199 |
| 3,437,393 | 4/1969 | Baker et al | 350/6 |
| 3,556,638 | 1/1971 | Banks et al | 350/161 |
| 3,612,642 | 10/1971 | Dostal | 350/6 |
| 3,642,344 | 2/1972 | Corker | 350/6 |
| 3,758,199 | 9/1973 | Thaxter | 350/285 |
| 3,769,531 | 10/1973 | Elkuch | 310/6 |
| 3,959,673 | 5/1976 | Montagu | 310/38 |

The Patents to Fain et al, to Barkow, to Baker, to Dostal, to Corker and to Montagu each use a torsion bar in one form or another as a basic component of optical ray deflection apparatus, but use electromagnetic drive means in much more complex structures than used in the apparatus according to the invention as set forth hereinbefore.

The Patents to Derderian, to Banks et al, and to Thaxter are directed to piezoelectric drive means for actuating an optical ray deflection device. The first patent shows torsion bar means, while the third patent shows a push-pull rotating means. The Banks and Rabedeau patent shows and describes a structure having a pair of plates with annular depressions and similar structural features, but otherwise does not teach the invention set forth here.

The only common factor involved in the Elkuch patent is the electrostatic drive control means used for generating periodical mechanical motion that could be used for an optical ray deflection device which is indeed a simple one, however, the resemblance comes no closer.

Probably the patent to Corker comes as close as any to realizing the structure according to the invention, but it is readily seen that there are patentable and practical differences of considerable importance in the art of optical ray deflection apparatus.

DRAWING

In order that all the advantages of the invention obtain in practice, the best mode embodiment thereof, given by way of example only, is described in detail hereinafter, with reference to the accompanying drawing, forming a part of the specification, and in which:

FIG. 3 is a cross-section view of the apparatus taken to the line 3—3 (in FIG. 1);

FIG. 4 is a schematic diagram of an electronic circuit arrangement for deflecting a light ray;

FIG. 5 is a diagram illustrating the essential relationships between the openings of masks used in photolithographically fabricating a device according to the invention;

FIG. 6 is a cross-section view of a torsion bar portion of the apparatus taken to the line 6—6 (FIG. 1)

DESCRIPTION

Figure 1:
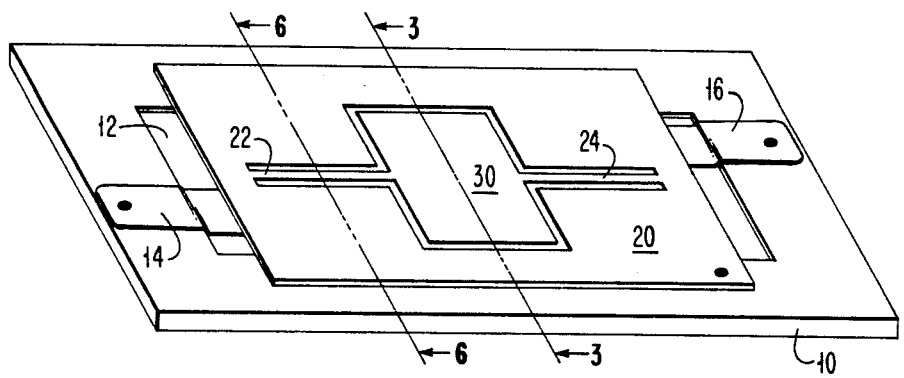
FIG. 1 is an isometric view of optical ray deflection apparatus according to the invention.

A view of an embodiment of optical ray deflection apparatus according to the invention as assembled is shown in FIG. 1. A substrate 10 of insulating material is partially etched away to form an annuloidal depression 12, later to be described in detail. A pair of conductive elements 14,16 are laid in the bottom of the depression 12 as will also be described in detail hereinafter. A semiconductor plate member 20, preferably made of silicon, is etched completely through to leave a pair of torsion bar portions 22,24 and a reflective armature portion 30 integrally formed by conventional photolithographical processes. Preferably, highly reflective material is deposited on the portion 30 for better light deflection. The material is chosen in accordance with the characteristics of the light whose rays are to be deflected. The silicon plate 20 is maintained at a neutral or ground reference potential and one of the conductive elements 14 or 16 is subjected to a relatively high potential which will effect rotation of the armature portion 30 about the longitudinal axis of the torsion bar portions 22,24. Those skilled in the art will devise circuitry wherein the two conductive elements are excited differently about the neutral potential for greater effect.

Figure 2:
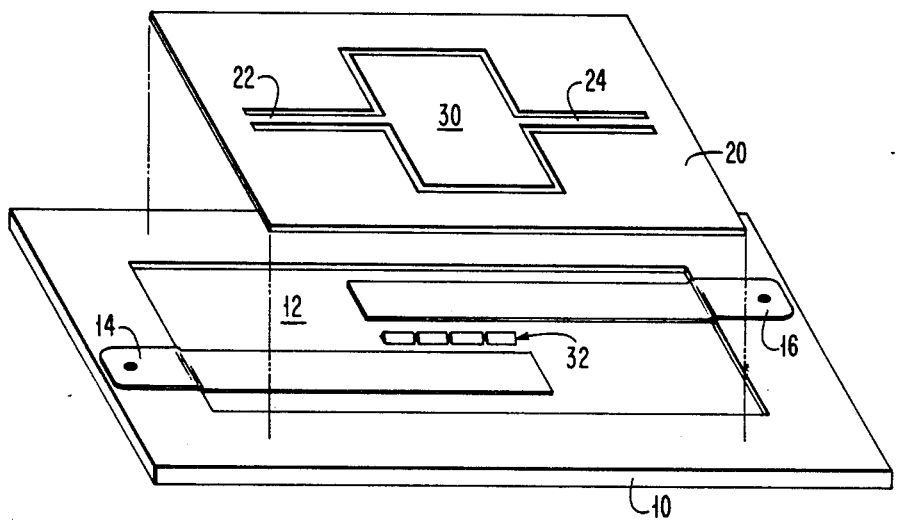
FIG. 2 is an isometric view of the apparatus disassembled in order to more clearly show the construction thereof.

FIG. 2 is a view of the apparatus before assembly with the silicon plate 20 superimposed over the insulating plate 10, but spaced away to more clearly reveal the structure of the latter. The depression 12 is now more clearly seen to be of annuloidal form in that lands 32 have been left centrally of the perimeter of the depression 12. The term "annuloidal" as used herein is construed to indicate a moat-like volume of rectangular configuration that is analogous to a tubular configuration having an annular cross-section. A single land is operable, but the "ventilated" lands as shown are preferred in order that air may move more freely as it is "pumped" by the oscillation of the armature portion 30. The land 32 lies beneath the armature portion 30 and is aligned with the torsion bar portions 22,24. The land 32 serves for confining the stress in the torsion bar portions to torsional moment with substantially little or no bending moment in the direction of the insulating plate 10. Also it can be seen that the conductive elements 14,16 underlie a relatively large portion of the reflective portion 30 of the armature whereby relatively large electrostatic force may be applied. A cross-section view to the line 3—3 (FIG. 1) is given in FIG. 3. As shown, the silicon plate 20 is maintained at ground level while the conductive element 16 is maintained at a relatively high potential of the order of 300 volts effective to attract the armature and rotate it about the upper edge of the land 32 against the torsional moment to which the torsion bar portions (not shown in this figure) are subjected. The effect is enhanced if the other conductive element 14 is maintained at the opposite polarity potential effective to repulse the armature 30 at the same time as the first conductive element 16 is attracting it. The circuit diagram here is suggestive only; those skilled in the art readily will arrange switching circuitry effective for the purpose.

One arrangement for energizing the optical ray deflecting apparatus is shown in FIG. 4. The apparatus according to the invention is shown schematically within the dashed rectangle 40. The armature 30' is connected to a point of fixed reference potential shown here as ground and to the center top 42 of a transformer winding 44 having two sections 44a and 44b. A primary winding 46 of the transformer is excited by a generator 48 of conventional construction. The secondary sections 44a and 44b each deliver potential of the order of up to 400 volts at relatively low current. The transformer is designed for excitation from a conventional low potential semiconductor oscillator circuit, which arrangement calls for step up transformers of the order of 10:1–40:1. The frequency of the oscillator 48 for the most efficient operation should be close to the resonant frequency of the armature of the apparatus. Frequencies of the order of 2–200 KHz are contemplated.

The semiconductor plate member 20 is preferably made of silicon but germanium and like materials are suitable alternates. The insulating plate member 10 is preferably made of silicon also, but other materials, notably glass, are entirely suitable. If both plate members are to be made of silicon the silicon dioxide coating used in the photolithographic etching process is left intact on at least one of the plate members and/or differential doping is in order for rendering a difference in characteristics of the plate members akin to the difference between conductive and insulating materials and the like.

An exemplary torsional scanner assembly consisting of only two separate components, at least one of which is a silicon plate member; both are fabricated using high precision photolithographic techniques in the following steps:

1. A silicon wafer ($\sim 150$ μm thick) oriented in the (100) plane is coated with $SiO_2$ (or other suitable) etchant masking material ($\sim 5000$ Å thick);
2. The pattern shown in FIG. 5(a) is oriented as shown and photolithographically etched in the masking material;
3. Using the resultant mask, the silicon wafer is etched in an anisotropic etchant of ethylenediamine, pyrocatechol, and water (for example) until the pattern is etched entirely through the wafer to form the silicon plate member 20;
4. The reflective surface area 30 is cleaned and a light reflecting coating is deposited on the reverse;
5. Sufficient masking material on one (either) side of the silicon plate member is removed for attaching an electrode or a wire;
6. Using a Cr-Au (for example) mask, a plan substrate plate 10 is etched in the pattern shown in FIG. 5(b) to a depth of about 25 μm;
7. Two electrodes 14,16 are deposited into the etched regions as shown in FIG. 2; and
8. The glass plate substrate 10 and the silicon plate member 20 are bonded together in the configuration shown in FIG. 1 with the obverse of the silicon plate member adjacent and separated from the obverse of the substrate member by the $SiO_2$ etchant masking material.

The operational parameters of the electrostatically deflected silicon torsional armature member are readily determined. The torsional resonant frequency of the vibrating structure is given by $$f = \frac{1}{2\pi} \sqrt{\frac{JG}{I(l/2)}} \qquad (1)$$

where

J is the polar moment of inertia of the silicon shaft,

G is the shearing modulus of elasticity of the silicon,
I is the moment of inertia of the mirror itself, and
l is the length of the silicon torsion shaft.

The polar moment of the inertia of the shaft is represented by $J = Kt^4$, where K is a constant depending on the cross-sectional shape of the shaft, and t is the thickness of the silicon plate member (FIG. 3).

FIG. 6 is a partial cross-section of the silicon plate member 20 showing the result of anisotropic etching and the cross-section of a torsion bar portion 22 (or 24). The obverse (100) plane is at the top of the figure. The thickness t of the silicon plate member 20 is ¾ of the width of a rectangle, indicated by the dashed lines 60, which has substantially the same constant $K = (0.22)t^4$ as the trapezoid area of the torsion bars. The ratio $J/A^2$, where A is the area of the cross-section of the torsion bar member, lies between 0.11 and 0.16 for simple cross-sections and is estimated to be about 0.13 for the trapezoidal shape here, which corresponds to $K = 0.24$.

Equation 1 is now expressed $$f_R = \frac{1}{2\pi} \sqrt{\frac{12 K E t^3}{\rho l b^4 (1 + \nu)}} \quad (2)$$

since $I = \rho b^4 t / 12$, where
$\rho$ is the density of silicon (2.32 gr/cm$^3$);
$G = E/2(1+\nu)$;
E is Young's modulus ($1.9 \times 10^{12}$ dyne/cm$^2$); and
$\nu$ is Poisson's ratio (0.09).

Deflection amplitudes of the torsion mirror as a function of potential are readily determined well below resonance. Total torque on the armature element is calculated by integrating the incremental torque over the half segment of the armature as electrostatically attracted by a single electrode.

$$T = \int_0^{b/2} F(x) x \, dx \quad (3)$$

where the electrostatic force is determined by the distance between the bottom of the armature 30 and an electrode 14 (or 16), $d(x) = d - \phi x$. Here $\phi$ is the angle of rotation of the armature 30 (as indicated in FIG. 3).

$$T = \tfrac{1}{2} \epsilon_0 V^2 b \int_0^{b/2} \frac{x \, dx}{(d - \phi x)^2} \quad (4)$$

$$= \frac{\epsilon_0 V^2 b}{2\phi^2} \left[ \ln\left(1 - \frac{\phi b}{2d}\right) + \frac{\phi b/2d}{1 - \phi b/2d} \right].$$

For high resonant frequency armatures ($\geq 10$ KHz), Q factors are relatively high ($>10$) so that the off-resonance angular displacement is small compared to $\phi_{max} = 2d/b$ (the maximum possible deflection angle of the mirror). Under these conditions the equation (4) can be approximated $$T = \frac{\epsilon_0 V^2 b^3}{16 d^2}. \quad (5)$$

Now a torque T on a shaft causes an angular twist in the shaft $$\phi = \frac{T(l/2)}{G(Kt^4)}. \quad (6)$$

Combining equations (5) and (6)

$$\phi = \frac{\epsilon_0 V^2 l b^3 (1 + \nu)}{16 K E d^2 t^4} A \quad (7)$$

for $\phi << \phi_{max}$ at frequencies far below resonance, where A is an area correction factor ($A \sim 0.8$), since the active bottom electrode area does not completely correlate with exactly ½ the armature area (due to rounded corners and the absence of electrode metallization near the land 32).

Reliability of such a vibrating structure depends on the total maximum stress encountered at the point of maximum torque. The maximum stress of a shaft with an equilateral triangular cross-section occurs at the midpoint of each side and is given by $$\tau_{max} = \frac{30.8 \, T_{max}}{(t')^3} \simeq \frac{9.5 \, T_{max}}{t^3} \quad (8)$$

where $t'$ is the height of the triangle and t is the actual thickness of the silicon ($t \sim 2t'/3$). Maximum torque is found from Equation (6), substituting $\phi = \phi_{max} = (2d/b)$;

$$\tau_{max} = \frac{(38) \, KE}{2(1 + \nu)} \left(\frac{dt}{bl}\right). \quad (9)$$

This corresponds to about $3.0 \times 10^9$ dyne/cm$^2$.

Finally, high precision optical scanning systems require elements with very low distortion. This can be a severe problem in high speed vibrating mirror armatures since the dynamic torque produces a surface distortion at the flyback position where the angular acceleration is greatest. The distortion, $\delta$, is given by $$\delta = (0.226) \left(\frac{\rho}{E}\right) \frac{b^5}{t^2} 2\phi_{max} f^2 (1 - \nu^2) \quad (10)$$

For the structure described here with $f = 15$ kHz, $\delta = 30$ nm, or about $\lambda/20$, at 6328 Å. More generally, however, it is known that silicon has an intrinsic advantage (in terms of distortion) over conventional materials used as torsional mirrors (quartz or glass) since the ratio ($\rho/E$) is almost three times smaller in silicon than in quartz. For the same mirror dimensions and operating parameters, then, silicon will typically exhibit about ⅓ the distortion of quartz.

Figure 7:
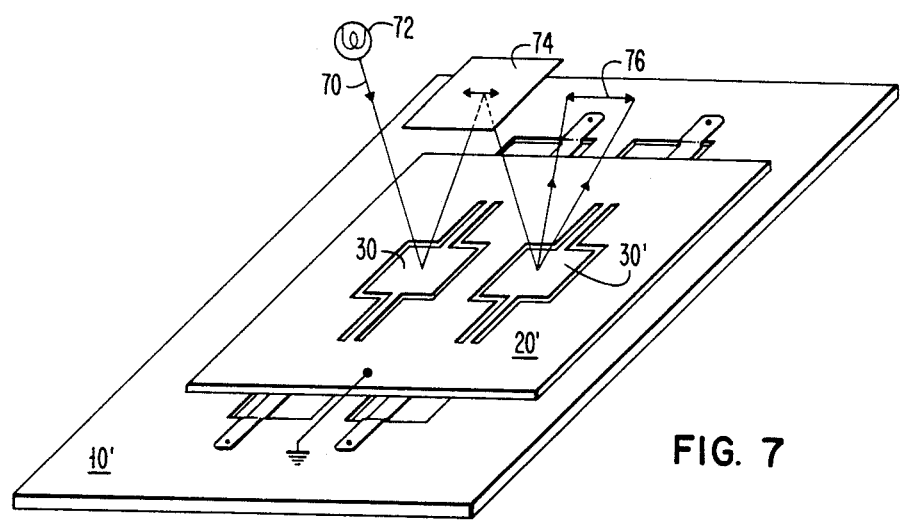
FIGS. 7 and 8 are illustrations of two plural armature embodiments of optical ray deflection apparatus according to the invention.

The construction of the optical ray deflection apparatus according to the invention lends itself to plural, and multiple, armature embodiments. FIG. 7 shows a plural armature embodiment for increasing the scan angle by a factor of 2. A ray of light 70 from a source 72 is deflected off the first mirror surface 30 to a fixed mirror 74 and thence off another mirror surface 30' whereby the angular deflection and the linear deflection indicated by the arrow 76 are twice those from the first mirror 30.

Figure 8:
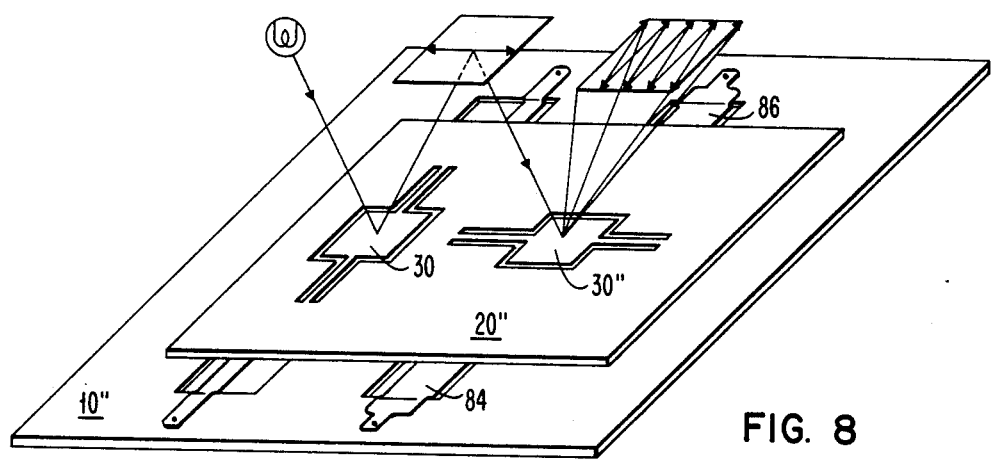

Three armature members are used for increasing the angle by a factor of 4 and so on. FIG. 8 is a plural armature version wherein the armatures move at 90° to each other. This provides an "X-Y" or raster scan. Note that the effective surfaces (not shown) of the electrodes 84 and 86 underly the armature 30" in the same manner as for the armature 30, but the leads are simply brought out laterally for greater convenience.

While the invention has been described in terms of an express embodiment, and alternate embodiments have been described, it should clearly be understood that those skilled in the art will make additional changes without departing from the spirit and scope of the invention as defined in the appended claims completing the specification.

The invention claimed is:

1. Optical ray deflection apparatus, comprising
 a base member,
 a torsion bar arranged on said base member for torsional movement with respect thereto and having an area defining an optically reflective surface,
 said torsion bar being an integral part of a torsion bar plate and said reflective surface area comprising an enlarged portion centrally located and an integral part of said torsion bar,
 said torsion bar plate being made of single crystal silicon and formed by an anisotropic etching process, and
 electrodes arranged on said base member for producing an electrostatic field adjacent said torsion bar in turn for producing deflecting movement of said reflective surface area.

2. Optical ray deflection apparatus as defined in claim 1, and incorporating
 an optically reflective medium arranged on said reflective surface area of said torsion bar.

3. Optical ray deflection apparatus as defined in claim 2, and wherein
 said reflective medium is a metal evaporated over said reflective surface area.

4. Optical ray deflection apparatus, including
 a base member,
 a torsion bar arranged on said base member for torsional movement with respect thereto and having an area defining an optically reflective surface, and
 said base member being an insulating plate having a centrally located recess etched therein over which said torsion bar is arranged, and
 electrodes arranged on said base member for producing an electrostatic field adjacent said torsion bar in turn for producing deflecting movement of said reflective surface area.

5. Optical ray deflection apparatus as defined in claim 4, and wherein
 a supporting land is located centrally of said recess over which said torsion bar is arranged.

6. Optical ray deflection apparatus as defined in claim 5, and incorporating
 planar electrodes arranged in said central recess of said insulating plate and on either side of said land.

7. Optical ray deflection apparatus as defined in claim 6, and wherein
 said electrodes are metal evaporated into the centrally located recess.

8. Optical ray deflection apparatus as defined in claim 6, and wherein
 said torsion bar plate is maintained at a neutral potential with respect to potential applied to said electrodes.

* * * * *